United States Patent
Belenger et al.

(10) Patent No.: US 6,940,986 B2
(45) Date of Patent: Sep. 6, 2005

(54) APPARATUS AND METHOD FOR REMOTELY AND AUTOMATICALLY CONTROLLING THE VOLUME OF AUDIO SIGNALS PRODUCED BY A REMOTELY CONTROLLED AUDIO DEVICE

(75) Inventors: Robert V. Belenger, Raynham, MA (US); Gennaro R. Lopriore, Somerset, MA (US)

(73) Assignee: The United States of America as represented by the Secretary of the Navy

( * ) Notice: Subject to any disclaimer, the term of this patent is extended or adjusted under 35 U.S.C. 154(b) by 356 days.

(21) Appl. No.: 09/808,973

(22) Filed: Mar. 16, 2001

(65) Prior Publication Data

US 2002/0131607 A1 Sep. 19, 2002

(51) Int. Cl.[7] ................................................. H03G 3/00
(52) U.S. Cl. ........................ 381/104; 381/105; 381/107
(58) Field of Search ................................ 381/104, 105, 381/107; 348/114, 14.05; 455/206.1, 219

(56) References Cited

U.S. PATENT DOCUMENTS 6,584,201 B1 * 6/2003 Konstantinou et al. ....... 381/57

2002/0057804 A1 * 5/2002 Mellott

* cited by examiner

*Primary Examiner*—Forester W. Isen
*Assistant Examiner*—Corey Chau
(74) *Attorney, Agent, or Firm*—James M. Kasischke; Jean-Paul A. Nasser; Michael F. Oglo

(57) ABSTRACT

An apparatus and method for remotely and automatically adjusting the volume of a remotely controlled audio device. In one embodiment, the apparatus comprises a sensor circuit for continuously detecting audio signals generated by the audio device, a difference circuit for determining the difference between the amplitude of the detected audio signals and a reference audio signal amplitude and for outputting a signal that represents this difference, a difference signal transfer circuit having an input for receiving the difference signal and an output wherein the difference signal is coupled to the output when the sensor circuit outputs a signal that indicates an audio signal has been detected, and a control circuit for generating a control signal that effects attenuation, augmentation or maintenance of the amplitude of the audio signals generated by the audio device in accordance with the difference signal when the sensor circuit detects an audio signal.

21 Claims, 2 Drawing Sheets

US 6,940,986 B2

APPARATUS AND METHOD FOR REMOTELY AND AUTOMATICALLY CONTROLLING THE VOLUME OF AUDIO SIGNALS PRODUCED BY A REMOTELY CONTROLLED AUDIO DEVICE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention generally relates to an apparatus and method for remotely and automatically controlling the volume of audio signals generated by a remotely controlled audio device.

(2) Description of the Prior Art

Remote control units are typically sold with television ("TV") sets and AM/FM radios. Remote control units are generally described in U.S. Pat. Nos. 4,221,006, 5,005,084 and 5,774,187. However, there are many other designs of remote control units that are now commercially available. Typically, the remote control unit communicates with circuitry within the audio device via transmitted signals that are encoded with particular sequences that define specific functions. Remote control units provide users with the capability to activate or deactivate the audio device, increase or decrease the volume, change channels or frequencies, mute the audio signals, and store commonly used channel or frequency information. Universal remote control units further include control functions that pertain to video cassette recorders and cable converter boxes. Most remote control functions, such as the channel-changing function, require no further adjustments after a channel has been selected. However, the volume control circuitry of conventional remote control units does not have a reference audio volume. Thus, the user must frequently vary the volume in order to find a comfortable volume level. For example, different TV stations broadcast signals having varying audio levels. Thus, the audio level varies as the user changes channels. In another example, the audio level associated with commercial ads is significantly higher than the audio level associated normal TV programs. As a result, the audio level is never constant.

SUMMARY OF THE INVENTION

Accordingly, it is an object of the present invention to provide an apparatus and method for remotely and automatically adjusting the volume of a remotely controlled audio device that eliminates the foregoing problems.

Other objects and advantages of the present invention will be apparent to one of ordinary skill in the art in light of the ensuing description of the present invention.

The present invention is directed to, in one aspect, an apparatus for remotely and automatically adjusting the volume of a remotely controlled audio device. In one embodiment, the apparatus comprises a sensor circuit for detecting audio signals generated by the audio device and generating a signal representative of the amplitude of the detected audio signal, a difference circuit for determining the difference between the amplitudes of the sensor circuit output signal and a reference audio signal and for generating a difference signal that represents this difference, a difference signal transfer circuit that has an input for receiving the difference signal and an output wherein the transfer circuit transfers the difference signal to the output when the sensor circuit output signal indicates detection of an audio signal, and a control circuit having an input connected to the output of the transfer circuit wherein the control circuit generates a control signal that effects attenuation, augmentation or maintenance of the amplitude of the audio signals generated by the audio device in accordance with the difference signal when the sensor circuit detects an audio signal.

In one embodiment, the sensor circuit comprises a directional microphone for detecting audio signals outputted by the device.

In one embodiment, the difference circuit further comprises an analog-to-digital-converter for converting the detected audio signals into digital data and digital circuitry for storing digital data representing the reference audio signal amplitude.

The circuitry of the control circuit is configured to generate a control signal that effects:

(a) attenuation of the amplitude of the audio signals generated by the audio device when the amplitude of the sensor output signal exceeds the reference audio signal amplitude by a predetermined magnitude;

(b) augmentation of the amplitude of the audio signals generated by the audio device when the reference audio signal amplitude exceeds the amplitude of the sensor output signal by a predetermined magnitude; and (c) maintenance of the amplitude of the audio signals generated by the audio device when the amplitude of the sensor output signal is substantially the same as the reference audio signal amplitude.

In yet a further aspect, the present invention is directed to a method for remotely and automatically adjusting the volume of a remotely controlled audio device, comprising the steps of detecting audio signals generated by the audio device and generating a signal representative of the amplitude of the detected audio signal, determining the difference between the amplitude of signal generated in the detecting step and a reference audio signal amplitude and generating a difference signal representing that difference, and generating a control signal that effects attenuation, augmentation or maintenance of the amplitude of the audio signals outputted by the audio device in accordance with the difference signal when the sensor circuit detects an audio signal.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

In describing the preferred embodiments of the present invention, reference will be made herein to FIGS. 1 and 2, in which like numerals refer to like features of the invention.

The present invention provides an apparatus and method for remotely and automatically adjusting the volume of audio signals generated by an audio device having a control signal receiver that enables the audio device to be remotely controlled. Such audio devices include remote controlled televisions, radios, stereos, or any other devices that produce audio signals and which can be remotely controlled.

Figure 1:
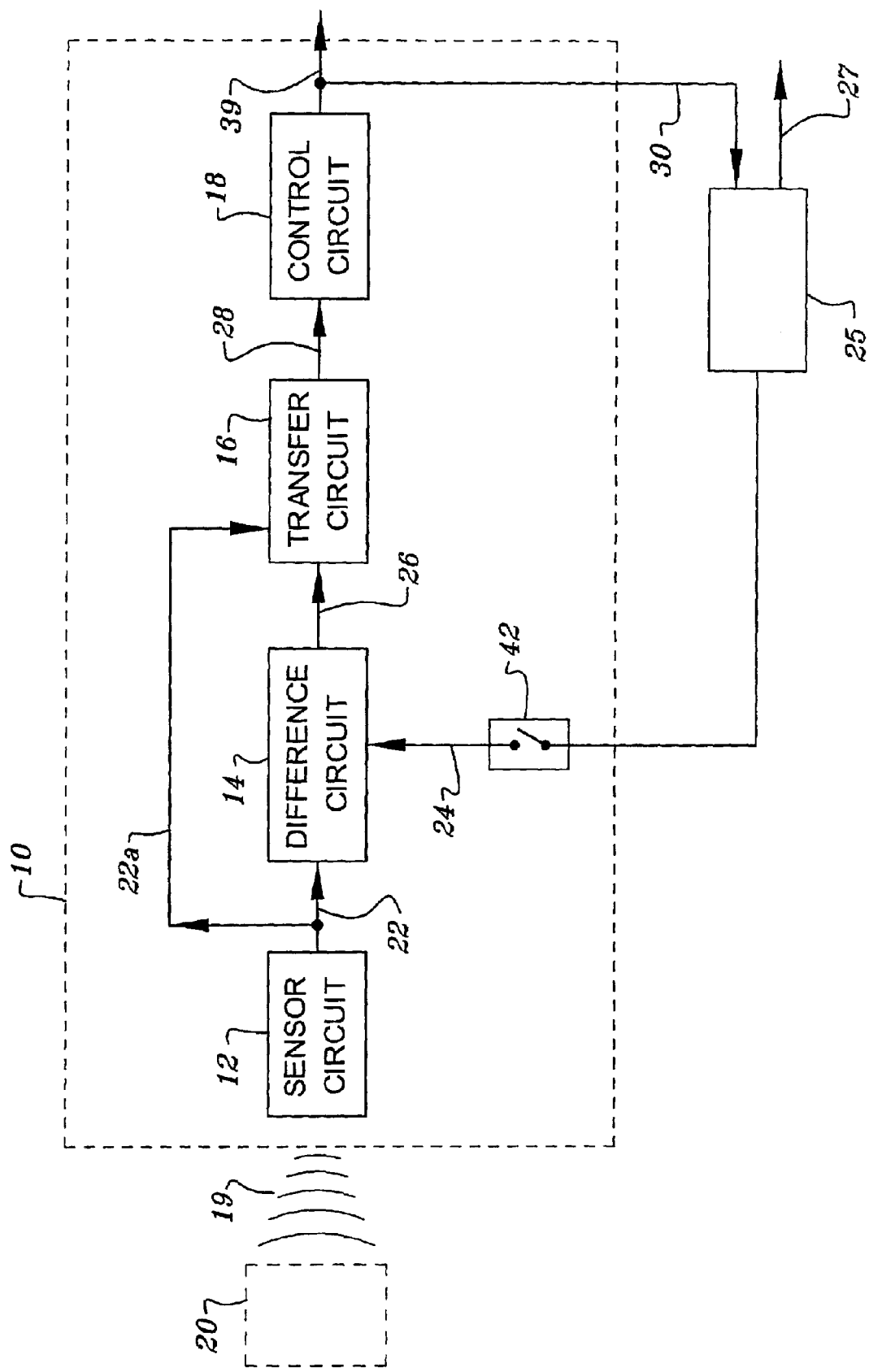
FIG. 1 is a block diagram of the apparatus of the present invention.

Referring to the FIG. 1, apparatus 10 of the present invention generally comprises sensor circuit 12, difference circuit 14, difference signal transfer circuit 16 and control circuit 18. Sensor circuit 12 is configured to continuously detect audio signals 19 generated by audio device 20 (shown in phantom) and output signal 22 that has a magnitude that is proportional to the magnitude of these detected audio signals. In one embodiment, sensor circuit 12 comprises a directional microphone. Difference circuit 14 determines the difference between the amplitude of signal 22 and reference audio signal amplitude 24 and outputs a difference signal 26 that is representative of the difference between amplitude of signals 22 and 24. Transfer circuit 16 is activated upon generation of signal 22 by sensor circuit 12, as shown by activation signal 22a. When activated, transfer circuit 16 transfers the difference signal 26, now represented by signal 28, to control circuit 18. Control circuit 18 generates control signal 30 that effects attenuation, augmentation or maintenance of the amplitude of the audio signals 19 generated by audio device 20 in accordance with the difference signal 28. Each of these components of apparatus 10 is explained in detail in the ensuing description.

Figure 2:
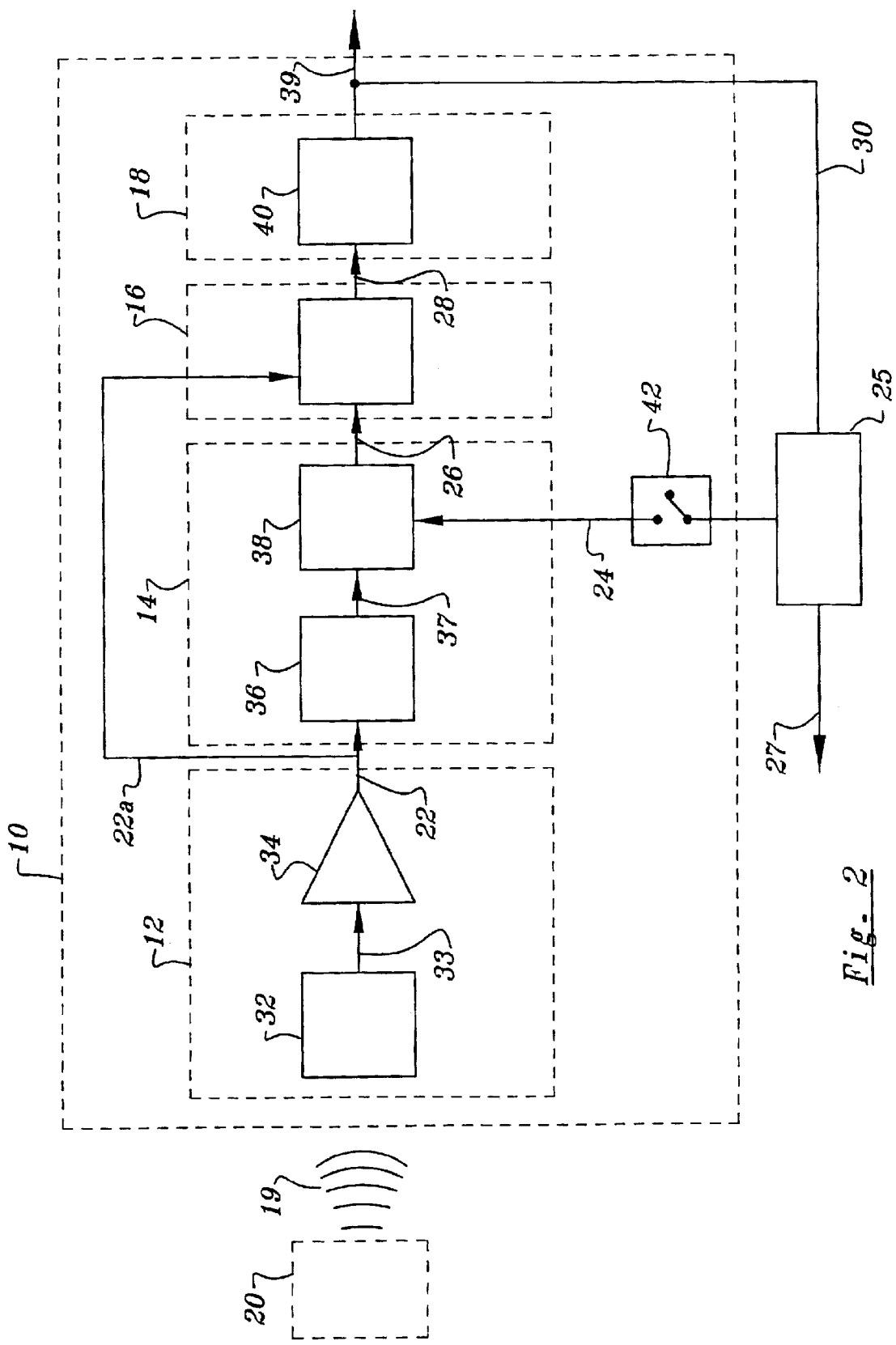
FIG. 2 is a block diagram showing component details of the apparatus of the present invention.

Referring to the FIGS. 1 and 2, in one embodiment, sensor circuit 12 comprises directional microphone 32 for detecting audio signals 19 outputted by audio device 20. Other commercially available acoustic or audio detectors also can be used. In one embodiment, directional microphone 32 outputs signal 33 that comprises a voltage that is proportional to the amplitude or level of the audio signals 19 outputted by the speakers (not shown) of the audio device 19. It is noted that signal 22 may also comprise a proportional voltage signal. In one embodiment, sensor circuit 12 further includes audio signal amplifier 34. Amplifier 34 amplifies signals 33 outputted by directional microphone 32. In a preferred embodiment, amplifier 34 is configured as a linear amplifier and has a sufficient signal-to-noise ratio that minimizes signal distortion. Whether amplifier 34 is utilized depends upon the proximity of apparatus 10 to audio device 20.

Referring to FIGS. 1 and 2, in one embodiment, difference circuit 14 comprises analog-to-digital converter ("ADC") 36 which converts the amplified signals outputted by amplifier 34 into multi-bit digital signals 37. The number of bits in multi-bit digital signal 37 depends upon the desired precision. In one embodiment, ADC 36 outputs an eight-bit signal. Difference circuit 14 further comprises adder/subtractor circuit 38. Adder/subtractor circuit 38 outputs difference signal 26 that was described in the foregoing description. Specifically, difference signal 26 represents the difference between the audio signal amplitude represented by multi-bit signal 37 and reference or desired audio signal amplitude 24. In one embodiment, reference audio signal amplitude 24 is provided by a volume level control circuit 25 of a standard remote control unit which utilizes apparatus 10. In such a configuration, a user adjusts the volume level control to provide a desired volume level. As a result, the aforementioned volume level control circuit outputs a multi-bit digital signal 24 that is inputted into adder/subtractor circuit 38. Difference signal 26 includes data that indicates whether the difference is negative or positive, i.e., whether the amplitude of signal 22 is greater or less than reference audio amplitude 24.

Referring to FIGS. 1 and 2, difference signal transfer circuit 16 includes a first input for receiving difference signal 26 and a second input for receiving activation signal 22a. Difference signal transfer circuit 16 transfers or routes difference signal 26 to control circuit 18 when signal 22a indicates that an audio signal has been detected. In one embodiment, transfer circuit 16 includes circuitry that determines whether the amplitude of signal 22a pertains to a detected audio signal or the absence of an audio signal. If transfer circuit 16 determines that signal 22a indicates the absence of any audio signals, then transfer circuit 16 does not effect a transfer of difference signal 26, also indicated as signal 28 outputted by transfer circuit 16, to control circuit 18. Thus, if a predetermined amount of time elapses in which signal 22a indicates the absence of audio signals, transfer circuit 16 terminates the transfer of the difference signal 28 to control circuit 18. Such a configuration prevents apparatus 10 from interpreting the absence of detected audio signals as a need to increase the volume of the audio signals 19. Difference signal transfer circuit 16 can be realized by commercially available sound activation circuits. Other suitable circuitry can be used as well.

Referring to FIGS. 1 and 2, once difference signal transfer circuit 16 is activated, difference signal 26 is transferred or routed as signal 28 to control circuit 18. Control circuit 18 includes control circuitry 40 that effects comparison of difference signal 28 to a plurality of thresholds (e.g., threshold voltages) in order to determine whether there is a significant difference between the amplitudes of reference audio signal 24 and sensor circuit output signal 22, or whether the difference between the amplitudes is negligible.

In one embodiment, control circuit 18 is configured with digital circuitry that compares difference signal 28 to a plurality of threshold voltage levels wherein each threshold voltage is represented by a corresponding multi-bit digital signal. Specifically, control circuit 18 determines the magnitude of the difference between reference audio signal amplitude 24 and the amplitude of sensor circuit output signal 22, whether the amplitude of signal 22 is greater or less than reference audio signal amplitude 24, the degree to which the volume of the audio signals 19 must be decreased or increased, and whether the volume of audio signals 19 is to be maintained at its current level.

Control circuit 18 then outputs multi-bit digital control signal 30 that is inputted into the volume control circuits 25 that are used in the standard remote control units. The volume control circuits 25 process control signal 30. Specifically, control signal 30 contains data that controls the volume control circuits 25 of the standard remote control unit to effect transmissions 27 of an encoded signal to audio device 20 that increases, decreases or maintains the volume of the audio signals 19. Control signal 30 controls the volume control circuits 25 of the standard remote control unit to maintain the current volume if the amplitude of signal 22 is generally the same as reference audio signal amplitude 24. In one embodiment, determining whether the amplitude of signal 22 is generally the same as reference audio signal amplitude 24 is accomplished by determining whether the amplitude of signal 22 is within a predetermined range of amplitudes wherein reference audio signal amplitude 24 is at the center of the predetermined range. For example, the reference audio signal amplitude 24 can be 100 millivolts and the predetermined range can be from 90 millivolts to 110 millivolts. The volume of the audio signals 19 will be maintained if the amplitude of signal 22 is within the range of 90 millivolts to 110 millivolts, inclusive.

In an alternate embodiment, control circuit 18 includes circuitry that is configured to implement the functions of difference signal transfer circuit 16. In a further embodiment, control circuit 18 is configured to include the volume control circuit 25 and to effect transmissions of the encoded signal as indicated by output signal 39.

In a preferred embodiment, apparatus 10 includes a switch 42 that permits a user to either activate or deactivate the automatic volume control feature of apparatus 10. If the user configures the switch 42 to deactivate apparatus 10, the standard remote control unit functions in the normal or typical manner. Once the user configures the switch 42 so as to activate apparatus 10, the automatic volume control function of apparatus 10 is implemented. In a preferred embodiment, after the user activates apparatus 10, the user maneuvers the standard remote control unit so that the directional microphone 32 (or other directional acoustic sensor) of sensor circuit 12 is pointed in the general direction of the speakers (not shown) of audio device 20.

Although the ensuing description is in terms of apparatus 10 being configured with digital circuitry, it is to be understood that apparatus 10 can be configured with analog circuitry. As shown by the foregoing description, a standard remote control unit can inexpensively be retrofitted to include apparatus 10. Alternatively, standard remote control units can be manufactured with apparatus 10 incorporated therein.

Thus, apparatus 10 of the present invention enables a user to monitor the acoustic or audio level outputted by speakers of the audio devices and compare that audio level to a reference or desired level that is manually inputted into the remote control unit by the user. As a result of such comparison, the audio level of the audio signals produced by the audio devices can be automatically increased, decreased or left unchanged.

Apparatus 10 provides many advantages and benefits, namely:

a) the volume of audio signals 19 is controlled automatically without the user having to continuously manually manipulate the volume control of the standard remote control unit;

b) audio device 20 does not have to be modified;

c) apparatus 10 can be realized with commercially available electronic components;

d) the automatic volume control feature of apparatus 10 can be activated or deactivated without interfering with the normal operation of the standard remote control unit;

e) the physical arrangement of circuitry of apparatus 10 within the standard remote unit can be varied to suit various standard remote control unit designs; and f) standard remote control units can be retrofitted with apparatus 10 at a relatively low cost.

The principals, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations in changes may be made by those skilled in the art without departing from the spirit of the invention. Accordingly, the foregoing detailed description should be considered exemplary in nature and not limited to the scope and spirit of the invention as set forth in the attached claims.

What is claimed is:

1. An apparatus for remotely and automatically adjusting a volume of a remotely controlled audio device, comprising:

a sensor circuit for detecting audio signals generated by the audio device and generating a signal representative of an amplitude of the detected audio signal;

means for obtaining a reference audio signal amplitude from a user;

a difference circuit for determining a difference between an amplitude of the signal outputted by the sensor circuit and the reference audio signal amplitude and for generating a difference signal that represents this difference;

a control circuit for generating a control signal that effects at least one of attenuation, augmentation and maintenance of the amplitude of the audio signals generated by the audio device in accordance with the difference signal; and a difference signal transfer circuit that transfers the difference signal to the control circuit when the sensor circuit detects an audio signal.

2. The apparatus according to claim 1 wherein the sensor circuit further comprises an amplifier for amplifying the detected audio signal before it is outputted to the difference circuit.

3. The apparatus according to claim 1 wherein the sensor circuit comprises a directional microphone for detecting audio signals outputted by the device.

4. The apparatus according to claim 1 wherein the means for obtaining a reference audio signal amplitude provides the audio signal amplitude in digital form, and the difference circuit further comprises an analog-to-digital-converter for converting the detected audio signal amplitude into digital data.

5. The apparatus according to claim 1 wherein the difference signal transfer circuit comprises a sound activation circuit.

6. The apparatus according to claim 1 wherein the control signal effects attenuation of the amplitude of the audio signals generated by the audio device when the amplitude of the sensor circuit output signal exceeds the reference audio signal amplitude by a predetermined magnitude.

7. The apparatus according to claim 1 wherein the control signal effects augmentation of the amplitude of the audio signals generated by the audio device when the reference audio signal amplitude exceeds the amplitude of the sensor circuit output signal by a predetermined magnitude.

8. The apparatus according to claim 1 wherein the control signal effects maintenance of the amplitude of the audio signals generated by the audio device when the amplitude of the sensor circuit output signal is generally the same as the reference audio signal amplitude.

9. The apparatus according to claim 1 wherein the control circuit comprises a transmitter circuit for transmitting the control signal to a control signal receiver of the audio device.

10. The apparatus according to claim 1 further comprising a switch that permits a user to activate or deactivate the apparatus.

11. The apparatus according to claim 1 further comprising a sound activation circuit that transfers the difference signal to the control circuit when the sensor circuit detects an audio signal.

12. An apparatus for remotely and automatically adjusting a volume of a remotely controlled audio device, comprising:

a directional microphone for detecting audio signals generated by the audio device and generating a signal representative of an amplitude of the detected audio signal;

obtaining a reference audio signal amplitude from a user;

a difference circuit for determining a difference between an amplitude of the signal outputted by the directional microphone and the reference audio signal amplitude and for generating a difference signal that represents this difference;

a control circuit for generating a control signal that effects at least one of attenuation, augmentation and maintenance of the amplitude of the audio signals generated by the audio device in accordance with the difference signal; and a sound activation circuit for transferring the difference signal to the control circuit when the directional microphone detects an audio signal.

13. A method for remotely and automatically adjusting a volume of a remotely controlled audio device, comprising:

detecting an audio signal generated by the audio device;

generating a detected audio amplitude signal representative of an amplitude of the detected audio signal;

obtaining a reference audio signal amplitude from a user;

determining a difference signal as the difference between the detected audio amplitude signal and the reference audio signal amplitude;

generating a control signal by means of a control circuit that effects at least one of attenuation, augmentation and maintenance of the amplitude of the audio signals generated by the audio device in accordance with the difference signal if the detected audio amplitude varies greater than a predetermined amount from the reference audio signal amplitude; and transferring the difference signal to the control circuit by means of a difference signal transfer circuit when an audio signal is detected.

14. The method according to claim 13 further comprising amplifying the detected audio amplitude signal.

15. The method according to claim 13 further comprising converting the detected audio amplitude signal into digital audio amplitude signal.

16. The method according to claim 15 wherein the step of obtaining comprises obtaining a digital reference audio signal amplitude; and the step of determining further includes comparing the digital audio amplitude signal and the digital reference audio signal amplitude.

17. The method according to claim 13 further including transmitting the control signal to a control signal receiver of the audio device.

18. The method according to claim 13 wherein generating the control signal comprises generating a control signal that reduces the volume of the audio signals generated by the audio device when the detected audio amplitude signal exceeds the reference audio signal amplitude by a predetermined magnitude.

19. The method according to claim 13 wherein generating the control signal comprises generating a control signal that increases the volume of the audio signals generated by the audio device when the reference audio signal amplitude exceeds the detected audio amplitude signal by a predetermined magnitude.

20. The method according to claim 13 wherein generating the control signal comprises generating a control signal that maintains the volume of the audio signals generated by the audio device when the detected audio amplitude signal is within a predetermined magnitude of the reference audio signal amplitude.

21. The method according to claim 13 wherein detecting the audio signal comprises:

providing an acoustic signal sensor; and positioning the sensor so as to facilitate reception of the audio signals generated by the audio device.

* * * * *